(12) United States Patent
Schmidt et al.

(10) Patent No.: US 7,598,109 B2
(45) Date of Patent: Oct. 6, 2009

(54) METHOD FOR FABRICATING MICROMETER OR NANOMETER CHANNELS

(75) Inventors: Oliver G. Schmidt, Stuttgart (DE); Yongfeng Mei, Stuttgart (DE); Dominic Thurmer, Stuttgart (DE); Francesca Cavallo, Stuttgart (DE)

(73) Assignee: Max-Plank-Gesellschaft zur Forderung der Wissenschaften E.V., Munich (DE)

( * ) Notice: Subject to any disclaimer, the term of this patent is extended or adjusted under 35 U.S.C. 154(b) by 338 days.

(21) Appl. No.: 11/668,379

(22) Filed: Jan. 29, 2007

(65) Prior Publication Data
US 2007/0178655 A1 Aug. 2, 2007

(30) Foreign Application Priority Data
Jan. 30, 2006 (EP) .................. 06001885

(51) Int. Cl.
*H01L 21/00* (2006.01)

(52) U.S. Cl. .................. 438/50; 257/415; 257/E29.324

(58) Field of Classification Search .................. 257/419, 257/E21.246, 415, E29.324; 438/53, 479, 438/50
See application file for complete search history.

(56) References Cited

U.S. PATENT DOCUMENTS
2003/0157783 A1* 8/2003 Fonash et al. ................ 438/458

OTHER PUBLICATIONS

Schmidt et al., "Three-Dimensional Nano-objects Evolving from a Two-Dimensional Layer Technology", Advanced Materials, Wiley VCH, Weinheim, DE, vol. 13, No. 10, May 17, 2001, pp. 756-759.*

* cited by examiner

*Primary Examiner*—Thanh V Pham
*Assistant Examiner*—Maria Ligai

(57) ABSTRACT

Thin films, which are deposited on a sacrificial film on a substrate, are released and bonded back on a substrate surface. This technology provides open and closed 2D confined micro-/nano-channels and channel networks on a substrate surface. The geometry, size and complexity of the channels and channel networks can be modified by the film and substrate properties as well as the treatment techniques of the sacrificial layer etching. A method to fabricate such structures with position- and pattern-controllability is provided.

10 Claims, 4 Drawing Sheets

METHOD FOR FABRICATING MICROMETER OR NANOMETER CHANNELS

Figure 1:
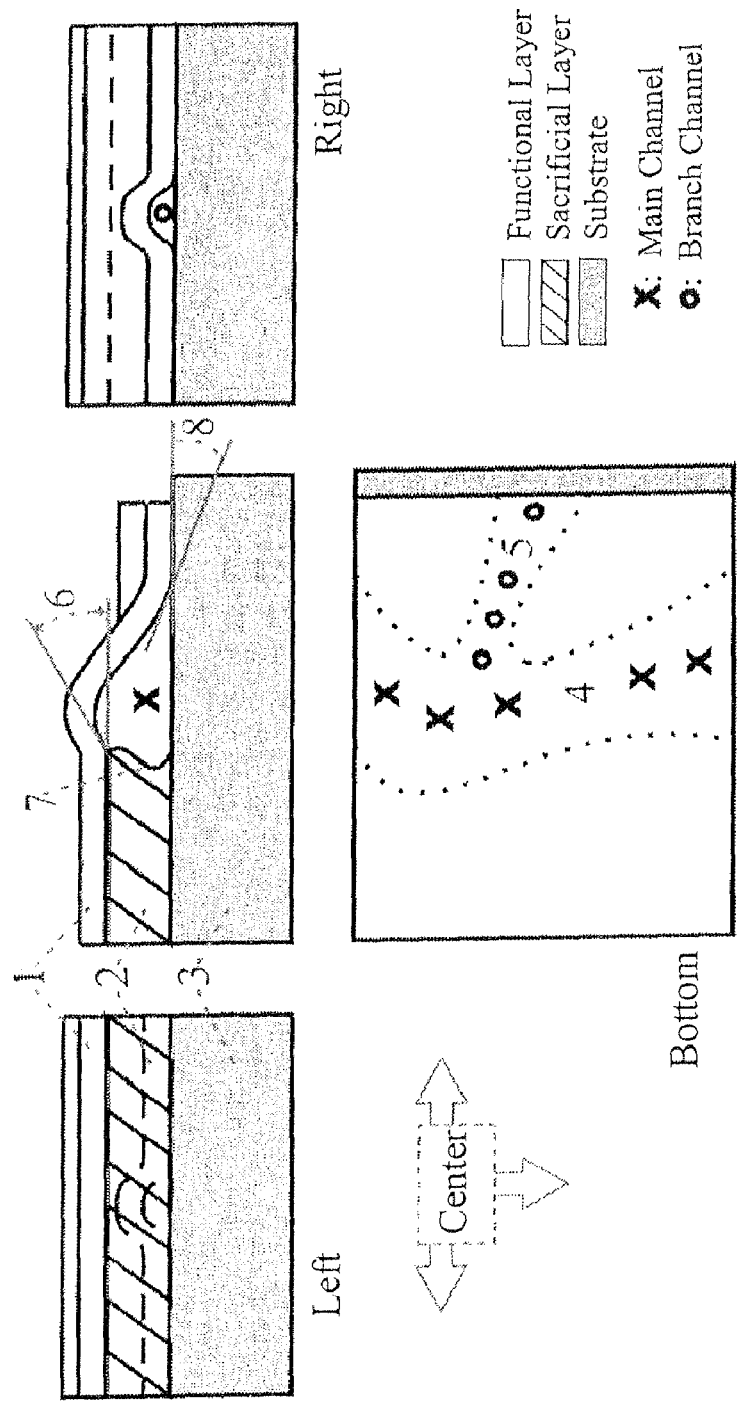

The present invention relates to a method for fabricating at least one micrometer or nanometer channel characterized by the features of claim 1.

One important aspect in nanotechnology is to develop methods for the controlled mass fabrication of functional nanostructures and their integration into usable macroscopic systems and devices. A more recent direction seeks to develop a layer releasing technology (including rolling, bending, and folding etc) to create well-controlled micro-/nano-architectures in their size, shape, position, and orientation. The variety of materials and treatments broaden the scope of fundamental investigations and potential applications of these architectures, such as micro-/nano-fluidics, MEMS/NEMS (Micro-electro-mechanical systems, Nano-electro-mechanical systems), and nano-electronics.

In the publication "Dislocation-free strained silicon-on-silicon by in-place bonding" by G. M. Cohen et al. in Applied Physics Letters 86, 251902 (2005) the fabrication of dislocation-free strained silicon slabs from pseudomorphic trilayer Si/SiGe/SOI by in-place-bonding is reported. Removal of the buried oxide allows the compressively strained SiGe film to relax elastically and induce tensile strain in the top and bottom silicon films. The slabs remain bonded to the substrate by van der Waals forces when the wafer is dried. Subsequent annealing forms a covalent bond such that when the upper Si and the SiGe layer are removed, the bonded silicon slab remains strained.

In the publication "2D-Confined Nanochannels Fabricated by Conventional Micromachining" by N. R. Tas et al. in Nanoletters, 2002, Vol. 2, No. 9, 1031-1032, two different methods are reported to fabricate nanochannels by conventional micromachining. The first method is based on the sacrificial etching of a nanowire, which was formed on the side wall of a step. The second method is based on the adhesion of the capping layer to the substrate after removal of a sacrificial strip separating the two.

The wrinkling phenomenon occurring during layer releasing is well-known by itself, however with increasing interest recently due to its fundamental understanding and experimental controllability for potential applications, for example flexible electronics and optical devices.

In the publication "Wrinkling of a debonded initially compressed $S_{1-x}Ge_x$ film" by A. I. Fedorchenko et al. in Journal of Mechanics, Vol 21, No. 3, p. 131-135 (2005), it is demonstrated that a compressively strained pseudomorphic $S_{1-x}Ge_x$ film forms wrinkles with a uniform space periodicity when it is debonded from Si substrate by selective etching. A layered structure is fabricated by epitaxially growing a thin sacrificial Si layer onto a Si substrate and epitaxially growing a SiGe layer onto the sacrificial layer. Normally SiGe has a higher lattice constant than Si, so that epitaxial growth of SiGe on Si is pseudomorphic resulting in a compressively strained state of the SiGe layer. In the etching process the thin Si layer and also the underlying Si substrate is etched. The amplitude and wavelength of wrinkles are determined by minimizing the total free energy of the debonded wrinkled film.

It is an object of the present invention to provide a method to fabricate micro-/nano-channels with an increased feasibility and flexibility. Moreover, it is an object of the present invention to provide a method for fabricating a network of micro-/nano-channels, i.e. a plurality of micro-/nano-channels being connected to each other.

These objects are solved by the method according to the features of claim 1.

The inventive method may be called Release and bondback of layers (REBOLA). This technology comprises the controllable wrinkling of a layer on a substrate. The substrate has on its top a bilayer structure: a functional top layer and a sacrificial bottom layer wherein the sacrificial bottom layer is removed selectively.

In particular the inventive method comprises the steps of
a) providing a layered structure including a substrate, a sacrificial layer on top of the substrate, and a compressively strained functional layer on top of the sacrificial layer,
b) selectively removing at least a portion of the sacrificial layer between the substrate and the functional layer.

In a preferred embodiment step b) comprises selectively etching the sacrificial layer, which may be accomplished by selecting a suitable etchant which comprises high etching selectivity, i.e. a high etch rate for etching the sacrificial layer as compared with the etch rate for etching the substrate and the functional layer The terms "micrometer" and "nanometer" refer to the cross-sectional dimensions of the channels. A micrometer channel may have at least one cross-sectional dimension in one direction of less than 10 µm, more preferably less than 5 µm, more preferably less than 2 µm. A nanometer channel may have at least one cross-sectional dimension in one direction of less than 500 nm, more preferable less than 200 nm, more preferable less than 100 nm, more preferable less than 50 nm.

A wide range of possible materials and their compositions can act as functional or sacrificial layers on common substrates. In a preferred embodiment step a) comprises selecting a first crystalline material for the sacrificial layer and a second crystalline material for the functional layer, wherein the second crystalline material has a higher lattice constant than the first crystalline material and the functional layer is grown epitaxially onto the sacrificial layer so that the functional layer is in a compressively strained state.

For example, according to the afore-mentioned preferred embodiment the second crystalline material may be $Si_{1-x}Ge_x$ where $0 \leq x \leq 1$ and the first crystalline material may be Si or $SiO_2$ or $SiO_x$ where $0 \leq x \leq 2$, in particular $0 \leq x \leq 1$. It is well-known, SiGe has normally a higher bandgap than Si. If an SiGe layer is epitaxially grown onto an Si layer the state of the SiGe layer is pseudomorph, i.e. the structure of the SiGe layer is lattice-matched but compressively strained.

With the inventive method is becomes possible to fabricate individual wrinkling channels or a network of connected channels as well as to add post-treatments for applications.

The method to fabricate micro-/nano-channels and/or their networks comprises controllable wrinkling of a functional top film on a sacrificial film on a substrate by selectively underetching the bottom film. These structures have potential applications in micro-/nano-fluidics as well as biotechnology (e.g. Lab on a Chip, bionics and drug delivery), micro-/nano-electronics (e.g. chip cooling system), and photonics (e.g. hollow waveguiding).

In a further preferred embodiment step b) comprises introducing an etchant into an opening of the layered structure, wherein the opening extends through the functional layer at least to the sacrificial layer, preferably to the substrate. Such opening may be provided in the surface of the functional layer and it may be intentionally formed, e.g. by means of conventional lithographical and mask/resist etching technologies.

In the above-mentioned preferred embodiment the opening may comprise the shape of an elongated groove, which may have the form of a straight or curved line. The groove may be produced by scratching the surface of the layered structure, e.g. with a diamond tip.

The opening may also have the form of a round circle, which also may be formed intentionally, e.g. by mechanical scratching the surface or by means of conventional resist and lithography technology.

The surface of the substrate is not limited to a flat surface. It may also have a curved or three-dimensional form.

A further embodiment of the invention is provided by a T-structure with micro-/nano-channels on a common substrate after releasing of a functional layer by selective removal of a sacrificial layer.

In another embodiment of the invention there are provided T-structures with micro-/nano-channels and their networks with linear, circular, and combined shapes with selective etching.

In case of an ultra-thin SiGe top layer as a functional layer and a $SiO_2$ bottom layer as a sacrificial layer formed on a Si substrate the selective etching may be performed by a hydrofluoric (HF) acid solution.

In yet another embodiment of the invention there are provided structures with individual wrinkling channels and their array.

Figure 3:
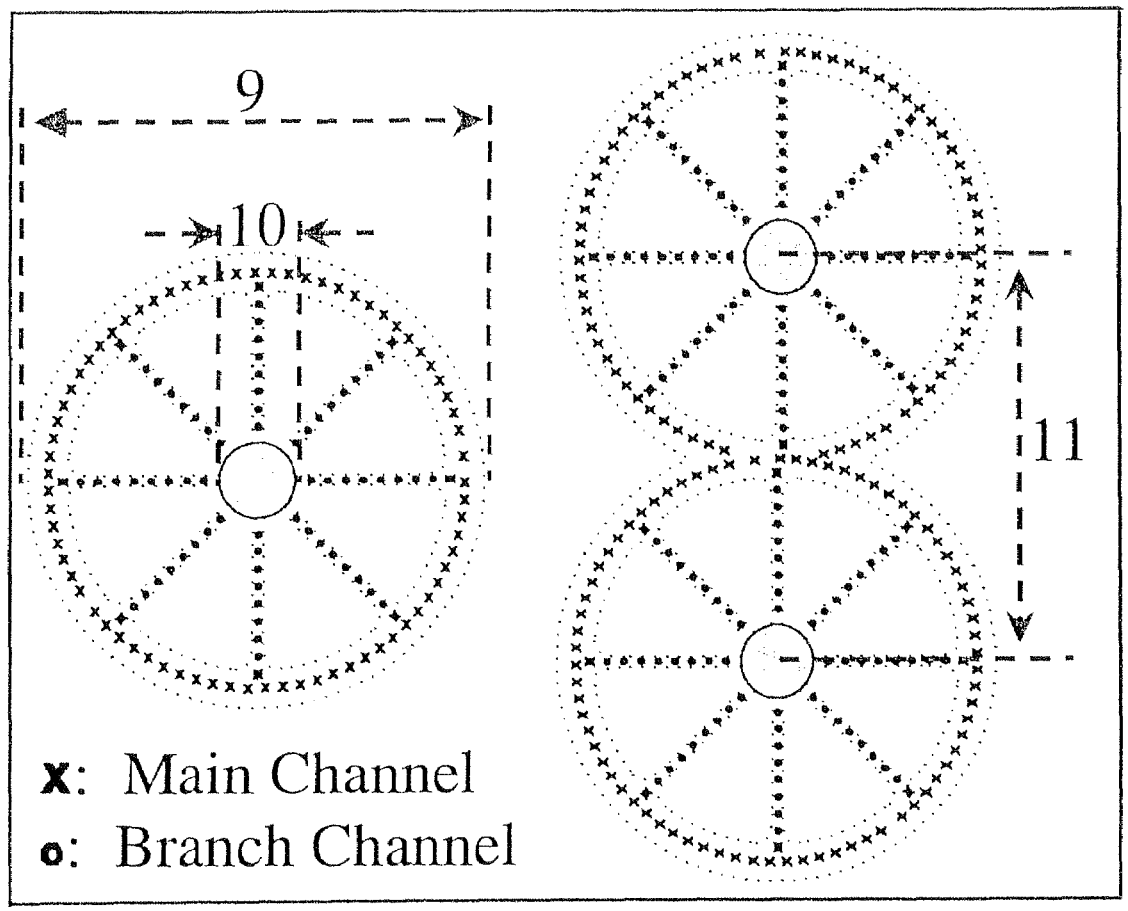
Figure 4:
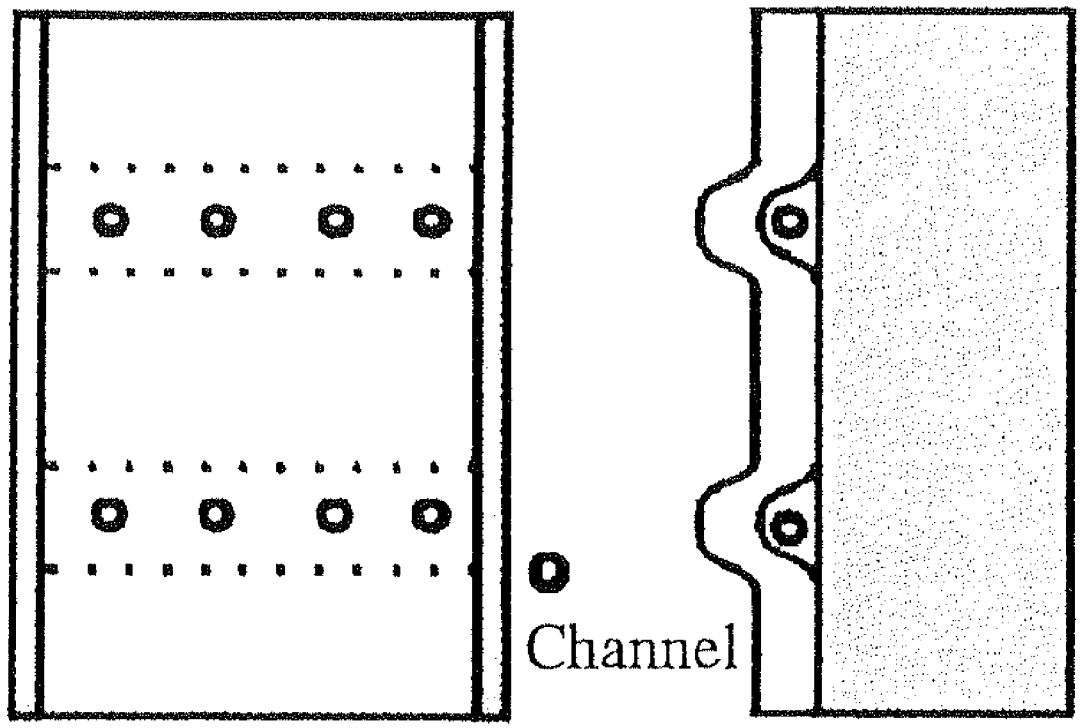

The present invention is explained in more detail in the following by way of specific embodiments in connection with the drawings, which represent FIG. 1 a general form of the structure fabricated by the inventive method as a first embodiment of the invention;

FIG. 2A to 2C a linear form of the structure fabricated by the inventive method as a second embodiment of the invention;

FIG. 3 a circular form of the structure fabricated by the inventive method as a third embodiment of the invention;

FIG. 4 a further specific form of the structure fabricated by the inventive method as a fourth embodiment of the invention.

The following descriptions and examples depict specific embodiments of the general invention in detail. Persons knowledgeable in the field will notice that there are many modifications and variations of this invention that are encompassed by its scope. Accordingly, the description given hereafter should not limit the scope of the general invention.

FIG. 1 is a multi-view diagram of the general structure. The structure as depicted in FIG. 1 consists of an arbitrarily shaped main channel with a branch channel of arbitrary shape and angle to this main channel. The center part of FIG. 1 is a schematic cross-section of the structure. Below this is a top view showing the main channel and branch channel. Right and left of the center image are views of the branch channel open and closed side, respectively.

At the right edge of the structure as depicted in the center part and bottom part of FIG. 1 it can be seen that an opening is formed where the layers 1, 2 are interrupted and the substrate 3 is exposed. The opening may be formed by scratching. Into this opening an etchant is introduced which selectively etches the sacrificial layer 2 from the right to the left. As a result the functional layer 1 is released and in some areas it bonds back to the substrate 3, e.g. due to capillary forces induced by the etchant. These areas form part of the main channel. In some other areas the functional layer 1 forms wrinkles which form the branch channels.

The deposition of the topmost layer 1 to create the proposed structure is of utmost importance. After releasing from the sacrificial layer 2, the functional layer 1 will attach to the substrate 3 in places, but also not attach as is the case in the main channel 4 and branch channel 5. The main channel 4 is defined as the non-attached space between the substrate and functional layer 1 which is also bordered by the sacrificial layer front 7. This sacrificial layer front 7 may also have an arbitrary profile. The attachment angle 8 may also be varied to give a range of specific geometries. Furthermore, it is not assumed that the functional layer 1, the sacrificial layer 2, or the substrate 3 should be of uniform thickness or composition. Grading of concentration and thickness was neglected from FIG. 1 for clarity of the structure.

Figure 2:
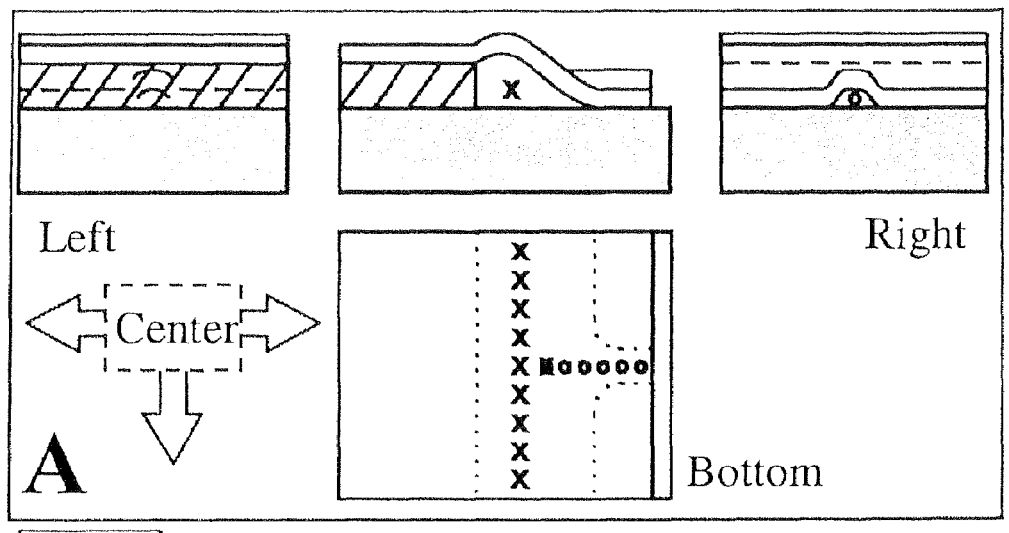
Figure 2:
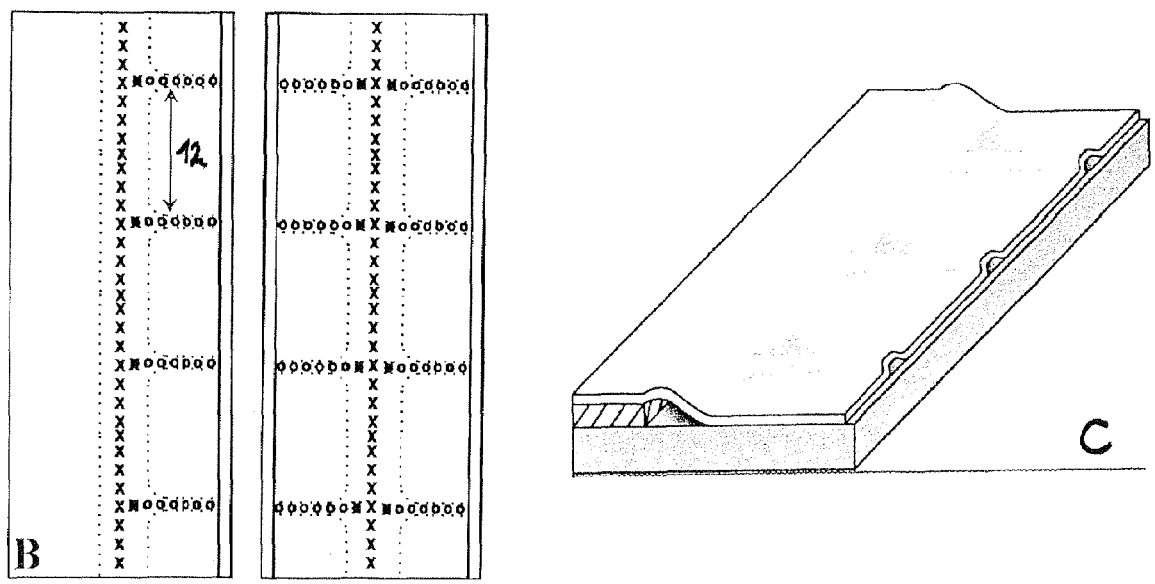

FIG. 2 depicts an example of the structure according to the general one of FIG. 1, showing a multi-view diagram of the structure (A). In this case the main channel and branch channel are perpendicular, and both channels have parallel walls. FIG. 2B represents array structures in both a single-sided case (left) and double-sided case (right). FIG. 2C is a 3-dimensional diagram of the structure.

FIG. 2A shows a multi-view diagram of the structure. Ultra-thin SOI (silicon on insulator) with a 27 nm thick top Si layer on 100 nm thick $SiO_2$ were loaded into an ultra-high vacuum molecular beam epitaxy (UHV-MBE) system. A 40 nm Si layer with uniform Ge composition of 8% was pseudomorphically grown on the ultra-thin SOI substrates at 350° C. After the growth the SiGe/SOI structures were oxidized in a tube furnace at 900° C. for 100 minutes, in oxygen ambient. The dry oxidation was followed by a 2 hours post annealing step, performed in nitrogen ambient. The grown $SiO_2$ layer was then removed by wet chemical etching, using a hydrofluoric (HF) acid solution.

The starting edge for the formation of the micro/nano channel network was realized by mechanically scratching the obtained SGOI substrates. The samples were then subjected to wet chemical etching, using an HF solution, in order to selectively etch the $SiO_2$ layer and allow the formation of the channel networks. This specific embodiment uses a geometry where the main channel has parallel walls and is perpendicular to the branch channel.

FIG. 2B is a diagram of an array of single elements in two configurations. The distance 12 between branch channels is variable and can be tuned, e.g. by the thickness or the degree of compressive strain of the functional layer. Single-sided and double-sided channel networks can be realized as shown in FIG. 2B on the left and right, respectively. In FIG. 2C the array structure is schematically shown.

It is also possible to fabricate two single-sided structures facing each other or a double-sided structure flanked by single-sided structures.

FIG. 3 is a schematic diagram of a circular case for a single center (left) or a double center (right).

Circular, arced and corner structures can be realized as depicted in FIG. 3, wherein a top view schematic diagram of a circular structure is shown. In these structures the branch channels extend radially from a central opening, out to the circular main channel. Such circular, arced and corner structures can also be connected to linear structures as those shown in FIG. 2.

The number of branches in the embodiment of FIG. 3 can be tuned, e.g. by the size of the central circular opening. The greater the diameter of the central circular opening, the more branches can be generated.

The radius 9 or 10 and the distance 11 between circular networks can be adjusted for suitable applications.

FIG. 4 represents an embodiment resulting from not having a main channel. FIG. 4 shows a schematic diagram of the proposed structure with individual wrinkling channels and their array, as well as post-treatments for applications. Scratching is exerted on both sides followed by the complete etching of the sacrificial layer.

A nano-channel complex network may be filled with fluorescing dye. Dye may be filled into the network at a filling spot using a glass micro-capillary (the capillary tip has ~5 μm outside diameter). The fluorescent dye is Rhodamine 6G, in a concentration of $5\times10^{-6}$ Molar (Moles/Liter) in ethanol.

Although the present invention has been shown and described with respect to several preferred embodiments thereof, various changes, omissions, and additions to the form and detail thereof, may be made therein, without departing from the spirit and scope of the invention.

The invention claimed is:

1. A method of fabricating at least one micrometer or nanometer channel, the method comprising:
   providing a layered structure including a substrate, a sacrificial layer on top of the substrate, and a compressively strained functional layer on top of the sacrificial layer,
   selectively removing at least a portion of the sacrificial layer between the substrate and the functional layer, to intentionally at least partially bond the functional layer onto a top surface of the substrate.

2. The method according to claim 1, wherein the selectively removing comprises selectively etching the sacrificial layer.

3. The method according to claim 2, wherein the selectively removing includes introducing an etchant in an opening of the layered structure, wherein the opening extends through the functional layer at least to the sacrificial layer.

4. The method according to claim 3, wherein the opening is intentionally formed into the layered structure.

5. The method according to one of claims 3 or 4, wherein the opening has the form of an elongated groove.

6. The method according to one of claims 3 or 4, wherein the opening has the form of a circle.

7. The method according to claim 1, wherein the providing of the layered structure includes selecting a first crystalline material for the sacrificial layer and a second crystalline material for the functional layer, wherein the second crystalline material has a higher lattice constant than the first crystalline material and the functional layer is grown epitaxially onto the sacrificial layer so that the functional layer is in a compressively strained state.

8. The method according to claim 7, wherein the second crystalline material is $Si_{1-x}Ge_x$ where $0 \leq x \leq 1$.

9. The method according to claim 7 or 8, wherein the first crystalline material is $SiO_x$ where $0 \leq x \leq 2$.

10. The method according to claim 9, wherein the x in the $SiO_x$ is $0 \leq x \leq 1$.

* * * * *

UNITED STATES PATENT AND TRADEMARK OFFICE
CERTIFICATE OF CORRECTION

PATENT NO. : 7,598,109 B2
APPLICATION NO. : 11/668379
DATED : October 6, 2009
INVENTOR(S) : Oliver G. Schmidt et al.

It is certified that error appears in the above-identified patent and that said Letters Patent is hereby corrected as shown below:

First Page, Column 1 (Assignee), Line 1, change "Max-Plank-Gesellschaft" to --Max-Planck-Gesellschaft--.

Signed and Sealed this

Nineteenth Day of January, 2010

David J. Kappos
*Director of the United States Patent and Trademark Office*